United States Patent [19]

Codrington

[11] Patent Number: 4,607,224
[45] Date of Patent: Aug. 19, 1986

[54] DOUBLE POST REENTRANT CAVITY FOR NMR PROBES

[75] Inventor: Robert S. Codrington, Los Altos Hills, Calif.

[73] Assignee: Varian Associates, Inc., Palo Alto, Calif.

[21] Appl. No.: 623,746

[22] Filed: Jun. 22, 1984

[51] Int. Cl.[4] .......................................... G01R 33/20
[52] U.S. Cl. ............................... 324/318; 324/58.5 C; 333/232; 333/235
[58] Field of Search ............... 324/318, 300, 307, 313, 324/321, 58 C, 58.5 C; 333/226, 232, 235

[56] References Cited

U.S. PATENT DOCUMENTS 3,187,278 6/1965 Wheeler .............................. 333/226

OTHER PUBLICATIONS

Yamamoto et al., "ENDOR Experiments on Free Radicals in Solution", Japanese Journal of Applied Physics, vol. 11, No. 10, Oct., 1972, pp. 1508–1513.

Primary Examiner—Stewart J. Levy
Assistant Examiner—Kevin D. O'Shea
Attorney, Agent, or Firm—Stanley Z. Cole; Edward H. Berkowitz

[57] ABSTRACT

A sample cavity resonator for NMR spectroscopy contains a pair of diametrically opposed paraxial post structures approximating a single turn inductance about the axially positioned sample. The posts are separately excited in 180 degree relative phases by respective coupling loops spaced between the corresponding post and the cavity wall. A slideable piston structure capacitively couples to the posts and provides cavity tuning.

6 Claims, 8 Drawing Figures

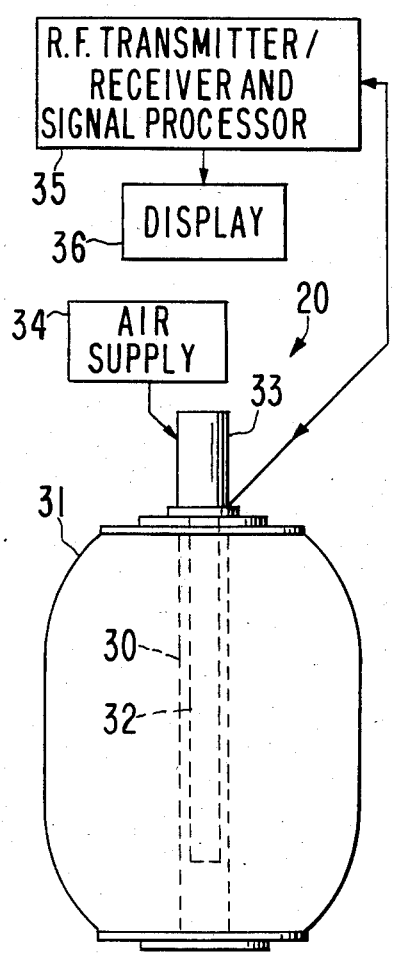
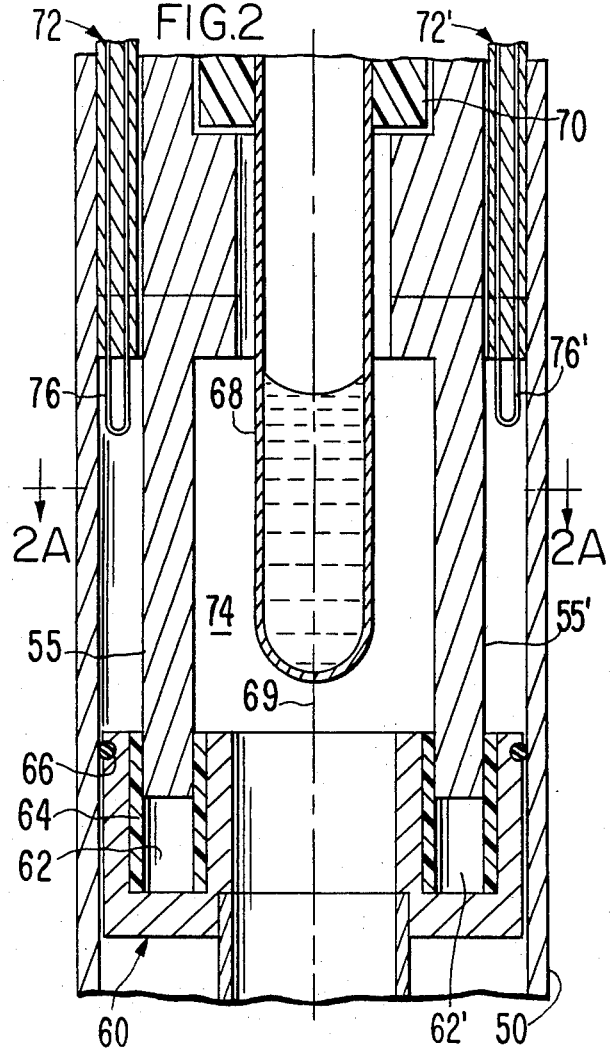
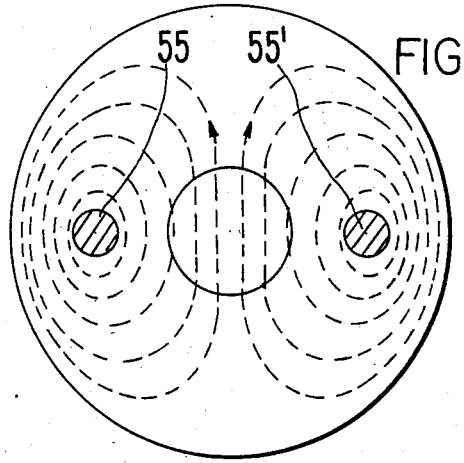
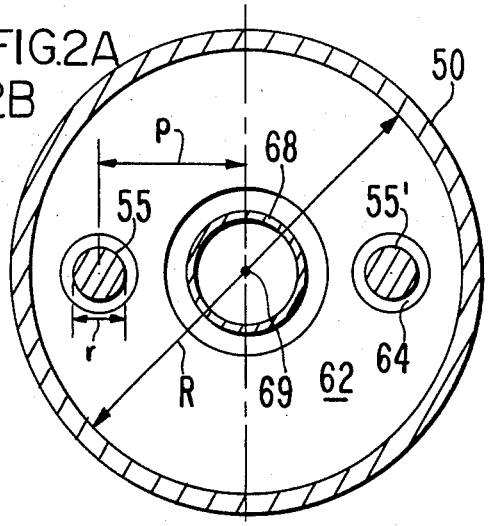
FIG. 1
FIG. 2
FIG. 2A
FIG. 2B

DOUBLE POST REENTRANT CAVITY FOR NMR PROBES

FIELD OF THE INVENTION

The present invention is in the field of nuclear magnetic resonance apparatus and particularly relates to probe construction for high frequency resonant probes.

BACKGROUND OF THE INVENTION

Resolution and sensitivity of NMR spectroscopy is substantially improved at higher resonance frequencies and progression in high resolution instruments has continued in this direction. At frequencies in excess of a few hundred MHz, discrete reactances in the RF subsystem become inappropriate elements for the resonant circuit and cavity resonators are preferred for the requirements of NMR spectroscopy.

In the prior art, Schneider and Dullenkopf proposed a slotted tube resonator (Rev. Sci. Inst., Vol. 48, No. 1, p. 68–73, January 1977) to achieve a sample irradiation cavity capable of supporting mechanical sample spinning and exhibiting high Q together with reasonable RF homogeneity. This structure comprised two symmetrical arcuate portions of a cylinder, axially elongate and coaxially mounted within an outer tube. The sample is disposed on axis surrounded by the arcuate portions which form a strip line. The slot(s) between the arcuate portions define capicitances in series with a net single turn inductance.

Another NMR resonator of prior art is described by Hardy and Whitehead (R.S.I., Vol. 52, No. 2, p. 213–216, February 1981) and is structurally a split ring forming a single turn inductance in parallel with a capacitance provided by the gap in the ring and coaxially disposed within an outer cylinder capable of supporting a TE propagation mode.

Yet another example of prior art is described by Hyde et al, U.S. Pat. No. 4,435,680. In one embodiment this resonator comprises an inductive element formed from arcuate portions arranged to define a plurality of gaps on a circumferential locus. The inductor is disposed coaxially within an outer shielding cylinder.

As in all NMR instruments, there are certain considerations which necessarily influence the apparatus design. It is important for the signal detection circuits or probe to exhibit adequate sensitivity and signal-to-noise ratio. For studies of magnetic moments of dilute concentration, e.g., $C^{13}$, adequate sensitivity will be quite high and incremental improvement in sensitivity is often sought. Contributing to this criteria is a desirability of a high filling factor for efficient volume irradiation capability in order to produce sufficient signal strength.

Additionally, the Q value of the probe circuits is desirably large because the signal-to-noise ratio is proportional to $\sqrt{Q}$. For low frequency (up to approximately 200 Mhz) the Q can be maintained at a sufficiently high value by the choice of the discrete resistive and reactive components typically employed. As the detection frequency icreases, however, the reactive component values must decrease to maintain the circuit resonance condition, $\omega^2 = 1/LC$ where L is the net inductive component and C is the net capacitive component. At high frequencies, L and C can be supplied primarily from the stray inductances and capacitances which couple the detection circuit to resistive circuits which in turn lower the Q.

A further requirement for relatively high Q is recognized from a desire to increase the magnitude of the rotating (RF) field of the excitation. This field is determined by the amplitude of the circulating current in the excitation circuit, which for a matched input can be shown to be proportional to $Q\sqrt{P}$ where P is the input power. Thus by using a sufficiently high Q excitation circuit, the input power can be kept low. In this way, sample heating is minimized or avoided, a particularly important advantage where the sample exhibits low dielectric loss. It is also important for samples with high dielectric loss, although in this case the sample itself will lower the cavity Q.

It is therefore apparent that high sensitivity and high Q are critical attributes. It is also essential that access to the sample be convenient.

BRIEF DESCRIPTION OF THE INVENTION

The present invention employs a reentrant cavity featuring two paraxial posts symmetricallly disposed about an axial central sample volume, and enclosed in an outer cylinder. The walls of the outer cylinder and the posts together form an inductance: series capacitances are retained between the fixed posts and a movable piston which tunes the cavity.

Excitation is achieved with coaxial cable coupling loops, each disposed in proximity to and parallel with the respective post. These coupling loops may be translated in the axial direction to obtain the desired cavity excitation. The loops are driven in phase opposition and are impedance matched by the series capacitances formed between the post and the receiver tuning cylinder.

BRIEF DESCRIPTION OF THE DRAWINGS

FIG. 1 is a simple block diagram of the system including the present invention.

FIG. 2 is a longitudinal section of one embodiment of the present invention.

FIG. 2A is a transverse section of the embodiment of FIG. 2.

FIG. 2B is the desired RF magnetic field distribution within the cavity.

DETAILED DESCRIPTION OF THE INVENTION

Figure 3:
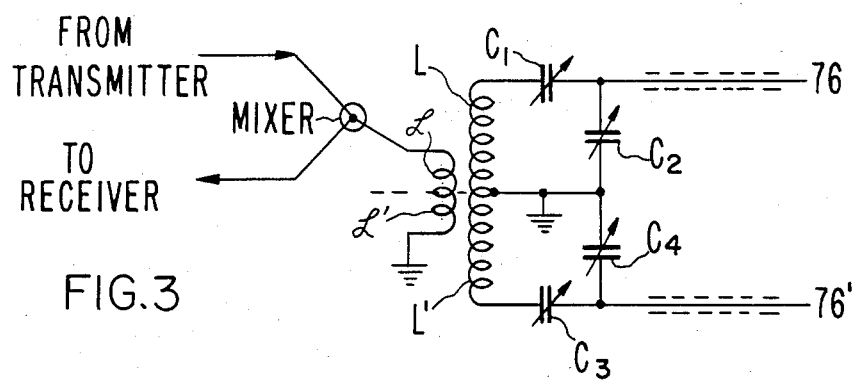
FIG. 3 is an equivalent circuit of the resonant cavity of the present invention.

The context of the present invention is best described with the aid of FIG. 1 which depicts a block diagram of a typical NMR analysis system. A high field superconducting magnet 31 is housed in a cryostat which features a room temperature bore 30 in which a probe module 32 is located. Secured to the top of the probe module is a spinner assembly 33 which receives a sample tube not shown. Spinner assembly 33 supports the high speed rotation of the sample tube in the axial magnetic field of superconducting magnet 31, such spinning implemented from an air supply 34 connected to the spinner to provide rotation thereto. An RF transmitter/receiver and signal processor 35 is connected to the probe subsystem 32, which probe includes means, not shown, for exciting and detecting resonance spectra of the sample in the sample tube. The signal processor also includes means for displaying the spectrum of the sample under examination as indicated schematically by display means 36.

The cavity body 50 is constructed from highly conducting material. Structural members, here discussed, are best constructed with concern for the gross magnetic susceptibility properties as well as electrical properties as discussed below. Typically, aluminum, copper, or brass are appropriate choices. Posts of similar material are formed of conducting rods suspended from the cavity end plate, not shown, in common electrical contact. For a cavity of inner radius R, the posts of this embodiment are of radius r and situated on a circle of radius p from the cavity axis. The lower closure of the cavity is obtained with piston assembly 60. Receiver cylinders 62 and 62' are formed on the end of piston assembly 60 to slidably engage the posts 55 and 55' while the outer surface of the piston itself engages the inner surface of the cavity body 50. The posts 55 and 55' are electrically isolated in the DC sense from the piston assembly by dielectric liners 64, preferably formed of thin wall teflon tubing. To facilitate translation of the piston assemblies 60 and O-ring seal or like arrangements is provided as indicated by seal 66. The values of r, p are calculable for specified operating conditions. These result from desired inductance (treating the posts as a single loop) and capacitance associated with receiver cylinders 62, 62' engaging posts 55, 55".

Sample tube 68 is suspended on axis 69 for rotation by spinner rotor 70. The details of spinner turbine construction and implementation. are to be found in U.S. Pat. Nos. 4,275,350; 4,088,944; 3,618,683; and 3,512,078, commonly assigned. The reader is referred to these works for discussion of spinner structure which is beyond the scope of the present work. One will recognize, however, that the present structure easily accommodates spinner means.

Coaxial conductor 72 and 72' are disposed in proximity with and parallel to the posts 55 and 55' and arranged for variable insertion and withdrawal along length of the sensitive region 74 of the cavity body 50. Inductive coupling loops 76 and 76' are formed in each of these coaxial conductors between the central and outer conductors thereof. As discussed below, these coupling loops are excited with a 180° phase difference therebetween. The preferred RF magnetic field pattern is shown in FIG. 2B. (Alternatively, capacitive coupling may be elected by suitable excitation post structure.)

FIG. 3 shows a circuit suitable for providing the desired phase shift for the inductive excitation loops 76 and 76' of the present invention.

The cavity of FIG. 2 is not optimal in respect of filling factor, and as a consequence, sensitivity is low. The posts 55 and 55' of FIG. 2 produce a limited region of RF magnetic field uniformity which can be enhanced by configuring the posts as qualitatively indicated at 155 and 155' in FIG. 4.

Figure 4:
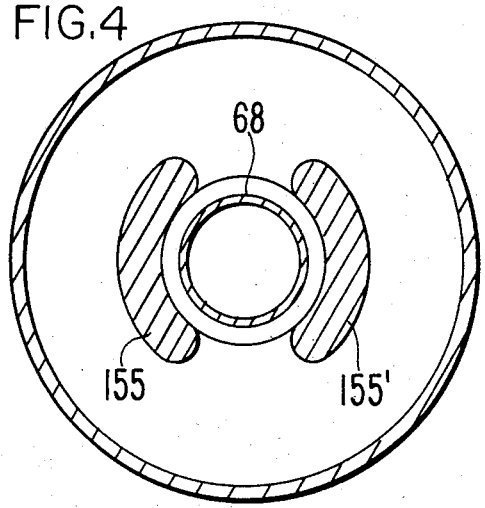
FIG. 4 shows an embodiment wherein the posts are specially shaped to provide enhanced filling factor.

While the filling factor is improved in the cavity of FIG. 4, the wrap-around posts lead to a somewhat diminished Q. The RF magnetic field distribution which is intercepted on the surfaces of the posts surrounding the sample will support eddy currents, which in turn affect the magnitude and direction of the magnetic component of the RF field. From a slightly different phenomenological point of view, eddy currents are a dissipative factor which reduce the energy stored in the RF field thereby lowering the Q.

Figure 5B:
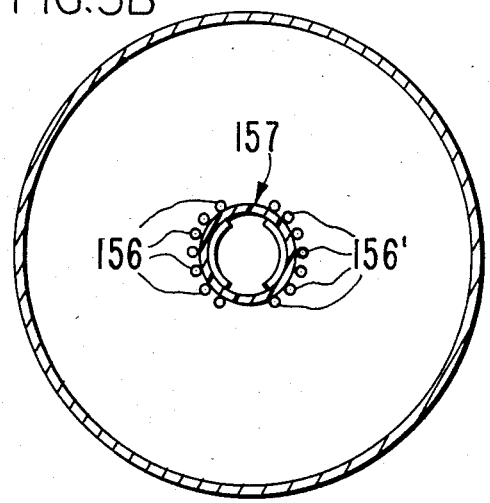
FIG. 5B is a section of the embodiment of FIG. 4A.
Figure 5A:
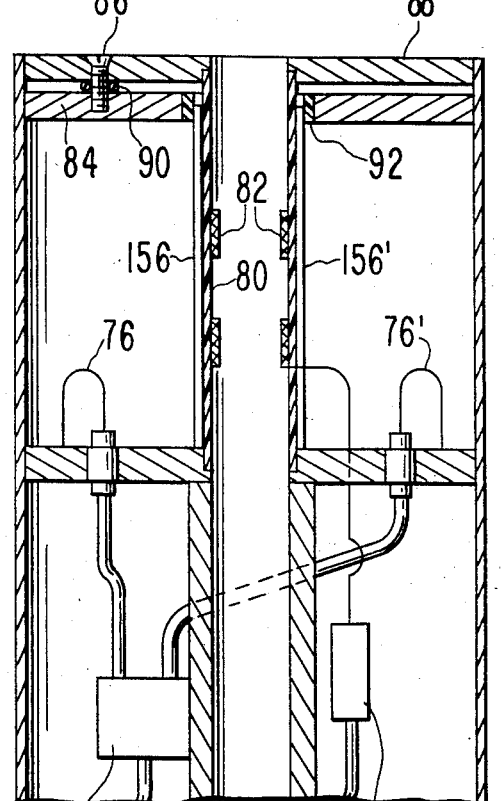
FIG. 5A represents another structural embodiment of the invention.

Turning now to FIGS. 5A and 5B there is shown a preferred variation, approximating the enhanced filling factor of the embodiment of FIG. 4, obtained by conceptually deforming posts 56 and 57 each into respective composite posts 156 and 156', each comprising a plurality of constituent posts spaced apart on opposite portions of the circle 157. Partial transparency to the RF magnetic field lowers the gross eddy current losses with consequent increase of the Q. Cylindrical insulator 80 is disposed in the cylinder of outer radius r to provide a surface mating with the observe coil 82 which is inserted therein. The observe coil 82 is preferably a saddle coil deposited upon a flexible substrate. Such coils are described for example in U.S. Pat. No. 4,463,648; U.S. Pat. No. 4,517,516 and U.S. Pat. No. 4,398,149, and need be described no further here. For the cavity of FIG. 5A the upper end closure 84 is capable of axial displacement under control of tuning screws 86 (one of which shown) bearing against fixed end plate 88. O-ring 90 or equivalent spring arrangement provides required resilience between fixed and movable end plates to stabilize the separation therebetween. The free ends of the constituent post assemblies 156 and 156' bear against dielectric bushings 92 disposed in a circular aperture on axis of the tunable closure plate 84. As in the above described embodiment, capacitive coupling is obtained through dielectric bushings 92 between closure plate 84 and composite posts 156 and 156'.

The excitation loops 76 and 76' are derived from a splitting network shown schematically at 94 and which includes adjustments sufficient to select the desired relative phase. Such a circuit is shown in FIG. 3. Tuning of the observe coil is provided at 96. Probe coil tuning and circuits therefor are more generally described in U.S. Pat. No. 4,095,168.

What is claimed is:

1. Nuclear magnetic resonance apparatus for analysis of a sample, comprising:

excitation means to provide RF excitation energy for exciting resonance of sample nuclei;

receiver means for response to RF signals eminating from said excited sample nuclei; and probe means for providing a sample space and irradiating said sample in said sample space with said excitation energy and to intercept the radio frequency radiation eminating from said sample, comprising:

(a) cavity means for sustaining a selected resonant radio frequency, comprising a cavity body and cavity piston for adjusting the cavity length along an axis thereof, (b) inductive means within said cavity body comprising a plurality of elongate members disposed in proximity to said sample space, said elongate members in common electrical contact at one end thereof and said piston adapted to receive each said inductive elongate member in a corresponding recess formed in the end of said piston without direct electrical contact between said member and said piston whereby a capacitive coupling is formed between each said inductive member and respective said piston, (c) excitation coupling means comprising a plurality of coaxial conductors, each further comprising a loop between the central and other conductor of said coaxial conductor, each said loop disposed in proximity to one said elongate member and adapted for translation along the axial extension of said elongate member, each said coupling loop communicating with said excitation means to provide selective phase of excitation energy to said proximate elongate member.

2. The apparatus of claim 1 wherein said cavity is cylindrical.

3. The apparatus of claim 2 wherein said coupling loop is disposed on a diameter of said cavity and the relative phase of said excitation energy between said pair of coupling loops is 180°.

4. The apparatus of claim 3 wherein said elongate members are elongate along a direction parellel to said axis.

5. The apparatus of claim 4 wherein said plurality of elongate members comprise two said elongate members disposed in axial symmetry about said axis.

6. The apparatus of claim 5 wherein said plurality of elongate members comprise two groups of said elongate members, said groups disposed in axial symmetry about said axis, each group of elongate members distributed azimuthally about said axis whereby said RF excitation is more homogeneously distributed within the region interior to said groups of elongate members.

* * * * *

UNITED STATES PATENT AND TRADEMARK OFFICE
CERTIFICATE OF CORRECTION

PATENT NO. : 4,607,224

DATED : August 19, 1986

INVENTOR(S) : Robert S. Codrington

It is certified that error appears in the above-identified patent and that said Letters Patent are hereby corrected as shown below:

Col. 1, line 30, delete "capicitances" and substitute --capacitances--.
      line 58, delete "Mhz" and substitute --MHz--.
      line 61, delete "icreases" and substitute --increases--.

Col. 4, line 16, delete "4,463,648" and substitute --4,563,648--.

Col. 6, line 2, delete "parellel" and substitute --parallel--.

Signed and Sealed this

Twenty-second Day of March, 1988

Attest:

DONALD J. QUIGG

*Attesting Officer*    *Commissioner of Patents and Trademarks*